(12) United States Patent
Besser et al.

(10) Patent No.: US 6,610,181 B1
(45) Date of Patent: Aug. 26, 2003

(54) METHOD OF CONTROLLING THE FORMATION OF METAL LAYERS

(75) Inventors: Paul R. Besser, Sunnyvale, CA (US); Paul L. King, Mountain View, CA (US); Susan Kim, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/845,952

(22) Filed: Apr. 30, 2001

(51) Int. Cl.[7] .......................... C23C 14/34; C23C 8/00; H05H 1/24; B05D 1/36; H01L 21/336
(52) U.S. Cl. .......................... 204/192.13; 204/192.15; 427/9; 427/585; 427/576; 427/404; 438/197; 438/199; 438/283
(58) Field of Search .......................... 427/9, 585, 576, 427/404; 438/197, 199, 283; 204/192.13, 192.15

(56) References Cited

U.S. PATENT DOCUMENTS

| | | | | |
|---|---|---|---|---|
| 5,132,745 A | * | 7/1992 | Kwasnick et al. | 357/4 |
| 5,270,222 A | * | 12/1993 | Moslehi | 437/8 |
| 5,523,246 A | * | 6/1996 | Yang | 437/34 |
| 5,740,226 A | * | 4/1998 | Komiya et al. | 378/70 |

FOREIGN PATENT DOCUMENTS

| JP | 57-91230 | * | 6/1982 | ........... B29C/27/14 |
|---|---|---|---|---|

OTHER PUBLICATIONS

English translation of JP 57–91230.*

* cited by examiner

*Primary Examiner*—Steven H. VerSteeg
(74) *Attorney, Agent, or Firm*—Williams, Morgan & Amerson

(57) ABSTRACT

The present invention is directed to a method of controlling the formation of metal layers. In one illustrative embodiment, the method comprises depositing a layer of metal above a structure, irradiating at least one area of the layer of metal, and analyzing an x-ray spectrum of x-rays leaving the irradiated area to determine a thickness of the layer of metal. In further embodiments of the present invention, a plurality of areas, and in some cases at least five areas, of the layer of metal are irradiated. The layer of metal may be comprised of, for example, titanium, cobalt, nickel, copper, tantalum, etc.

28 Claims, 2 Drawing Sheets

METHOD OF CONTROLLING THE FORMATION OF METAL LAYERS

BACKGROUND OF THE INVENTION

1. Field of the Invention

The present invention is generally directed to the field of semiconductor manufacturing, and, more particularly, to a method of controlling formation of metal layers.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

The manufacture of integrated circuit devices involves the formation of many layers of materials and, in some situations, the selective removal of portions of those layers using known photolithographic and etching processes. Such layers may be comprised of a variety of materials, e.g., metal, an insulating material, polysilicon, etc.

Sputter deposition, or physical vapor deposition (PVD), is widely used for forming thin layers of metals. Sputtering involves removing atoms from a solid material, or target, and then depositing the resultant vapor on a nearby substrate. Sputter deposition is usually performed in a diode plasma based system known as a magnetron sputtering tool. In this type of system, the cathode (or target) is sputtered by ion bombardment and emits metal atoms that are deposited on the wafer in the form of a thin film. Layers of metal may also be formed using chemical vapor deposition ("CVD") processes.

As set forth above, magnetron sputtering tools are typically comprised of multiple chambers and a load/lock chamber for transferring wafers into and out of the various process chambers. The working chambers of such systems are manufactured from stainless steel, and the base pressure of such a system is generally below $10^{-6}$–$10^{-8}$ Torr. Typically, the working pressure during sputtering is on the order of approximately 0.5–30 mTorr. Sputtering involves introducing a relatively high gas flow rate, e.g., 50–100 sccm of argon, nitrogen or xenon into a sputter deposition chamber to reach the sputtering working pressure. Magnetron sputter deposition systems are commercially available from a variety of vendors. For example, Novellus offers its Inova sputter deposition system and Applied Materials offers its Endura or Electra sputter deposition systems.

The deposited thickness of the metal film is typically controlled by controlling the duration of the deposition process. The deposition rate of the system is calibrated against time, and then a layer of metal is deposited for fixed time period. However, the thickness of the deposited layer is difficult to control for a variety of reasons, e.g., changes in sputter rate due to changes in target thickness, changes in the temperature of the system, and changes in pressure due to varying gas pumping rates. Moreover, such variations may occur from wafer-to-wafer (within run variations) and from lot-to-lot (run-to-run variations).

Test wafers are employed in attempts to monitor and control the thickness of deposited metal layers. More particularly, metal layers are deposited on such test wafers, and a variety of destructive and non-destructive metrology tests may be performed to determine the as-deposited thickness of the metal layer. For example, the test wafer may be cross-sectioned, and the thickness of the metal layer may be determined using a scanning electron microscope. Alternatively, the thickness of the metal layer may be determined using an elliposometer or an opto-acoustic method. However, these test wafers are relatively expensive, and thickness variations outside of acceptable limits may not be determined until well after additional wafers have been produced. As a result, the additional wafers may have to be scrapped if the deposition process is producing metal layers having a thickness outside of an acceptable range. Even if it is determined that the metal film on the product wafer had a thickness outside of an acceptable range, it is extremely difficult to change this thickness once the metal film is removed from the low-vacuum, low-pressure, multi-chamber environment of commonly employed deposition systems.

The present invention is directed to a method that may solve, or at least reduce, some or all of the aforementioned problems.

SUMMARY OF THE INVENTION

In general, the present invention is directed to methods of controlling the formation of metal layers. In one illustrative embodiment, the method comprises depositing a layer of metal above a structure, irradiating at least one area of the layer of metal, and analyzing the spectrum of x-rays leaving the irradiated area to determine a thickness of the layer of metal. In further embodiments of the present invention, the layer of metal may be comprised of titanium, cobalt, nickel, copper, molybdenum, etc. In yet further illustrative embodiments, a plurality of areas of the layer of metal are irradiated with x-rays.

In another illustrative embodiment, the method comprises depositing a first layer of metal above a structure, irradiating at least one area of the first layer of metal, analyzing an x-ray spectrum of x-rays leaving the irradiated area of the first layer of metal to determine a thickness of the first layer of metal, depositing a second layer of metal above the first layer of metal, irradiating at least one area of the second layer of metal, and analyzing an x-ray spectrum of x-rays leaving the irradiated area of the second layer of metal to determine a thickness of the second layer of metal.

BRIEF DESCRIPTION OF THE DRAWINGS

The invention may be understood by reference to the following description taken in conjunction with the accompanying drawings, in which like reference numerals identify like elements, and in which.

Figure 1:
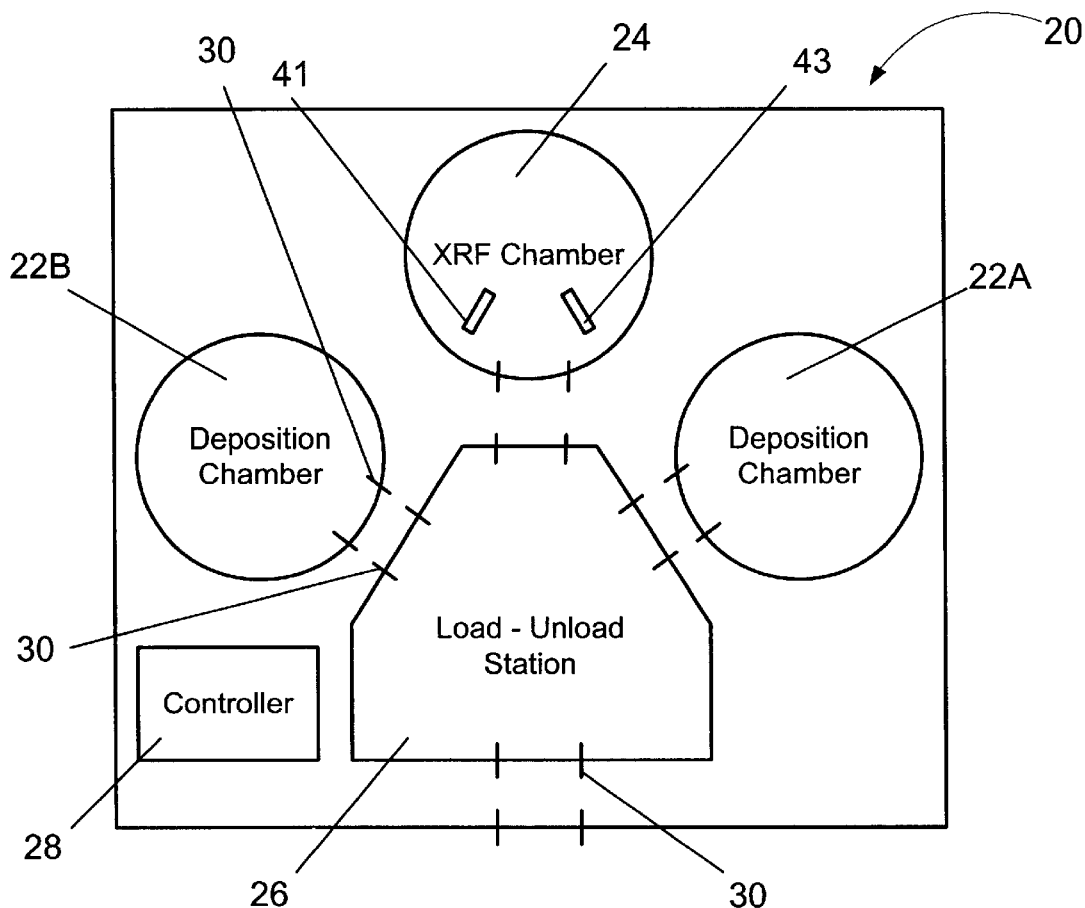
FIG. 1 is a schematic depiction of one embodiment of a system in which the present invention may be employed.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of controlling the formation of metal layers. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

In general, the present invention is directed to the use of x-ray fluorescence (XRF) measurements to control the thickness of deposited metal films. FIG. 1 depicts an illustrative system 20 that may be used with the present invention. In the depicted embodiment, the system 20 is comprised of a plurality of process chambers 22A, 22B, an XRF chamber or tool 24, a load/unload station 26, and a controller 28. The chambers 22A, 22B, 24 and the load/unload station 26 are provided with one or more sealable slots 30 that may be opened and closed as desired to allow wafers to be transferred as desired within the system 20. The slots 30 allow isolation of various portions of the system 20 as desired by processing conditions. The controller 28 may be a stand-alone controller resident somewhere in the manufacturing facility, or it may be a controller resident in the system 20 and/or the XRF tool 24.

Figure 2:
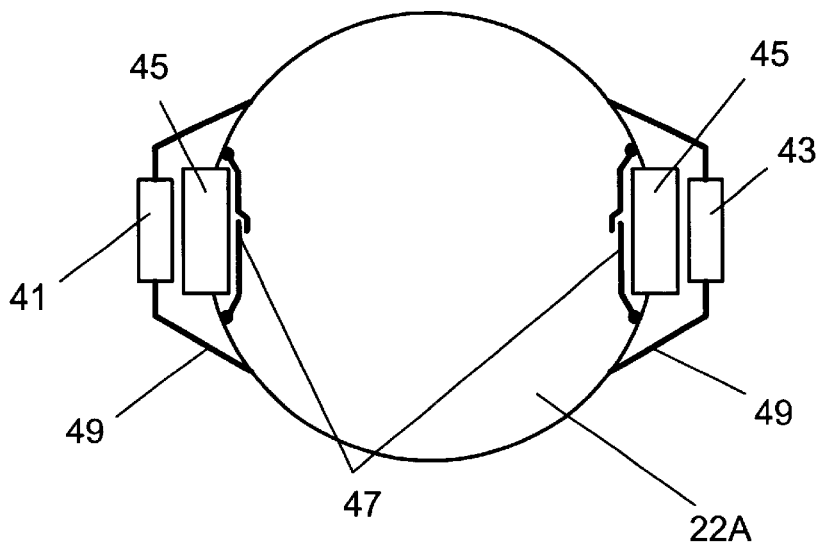
FIG. 2 is an alternative embodiment of a system in which the present invention may be employed.

The XRF chamber or tool 24 may be any type of tool useful for producing x-ray fluorescence metrology data that will enable detection of the presence of a metal film formed on a wafer. As schematically depicted in FIGS. 1 and 2, the XRF tool 24 is comprised of an x-ray source 41 (typically an x-ray tube) and a detector 43. The XRF tool 24 will be used to irradiate one or more areas of a layer of metal formed above a wafer. X-ray fluorescence measurements involve using ionizing radiation to excite the sample within the irradiated area, and detecting and measuring the x-rays leaving the sampled area that are characteristic of the elements in the sample. The detector 43 is used to detect the x-rays leaving the sample. In one illustrative embodiment, the XRF tool 24 may be an Omicron™ manufactured by Kevex of Redwood, Calif. Those skilled in the art will recognize that all details of the tool 24 are not depicted in FIG. 1. For example, such a tool 24 may also include a degas chamber, a sputter etch chamber, and additional transfer or sputter chambers. For clarity, those details have not been shown in FIG. 1.

The XRF technology described in the present application may be implemented in a variety of physical configurations. For example, the XRF tool 24 may be implemented within a single chamber, such as the XRF chamber 24 depicted in FIG. 1. In another embodiment, the components of the XRF tool 24, e.g., the source 41 and the detector 43, may be mounted in situ in one or more of the process chambers 22A, 22B. For example, as shown in FIG. 2, the deposition chamber 22A may be provided with a plurality of windows 45, thereby allowing x-rays from the source 41 to be used to irradiate a wafer (not shown) in the chamber 22A, and the detection of excited rays by the detector 41. The windows 45 are provided with shutters 47 to protect the windows 45 during the actual metal deposition process. The windows 45 may be of any size, shape or configuration. Moreover, the shutters 47 may be actuated by a variety of mechanical linkage systems and drive motors to open the shutters 47 so as to allow x-ray analysis of a metal layer formed during the deposition process. The source 41 and the detector 43 may be secured to the deposition chamber 22A by a variety of structural members 49.

In another illustrative embodiment, the present invention may also be employed in situations where the XRF tool 24 is a stand-alone processing tool. In that embodiment, after wafers 52 are processed, they are then transferred to the XRF tool 24 where the appropriate XRF metrology data is obtained. For example, after metal deposition operations are complete at chamber 22A, the wafer 52 may be transported to a stand-alone XRF tool 24 to determine if the operations at chamber 22A were successful. If not, the wafer 52 is returned to chamber 22A or 22B for further processing. If the results are acceptable, then the wafer 52 may be allowed to pass for further processing. However, using such a stand-alone configuration may be problematic in that, after breaking vacuum, the metal layer may oxidize, thereby making formation of additional metal above the metal layer more difficult.

When exposed to x-ray radiation, different materials fluoresce at different wavelengths. An x-ray spectrum is typically generated for the detected x-rays, and this spectrum is plotted on an intensity vs. energy basis. The intensity of the detected x-rays is measured in counts. For samples less than approximately 1 $\mu$m in thickness, the intensity is proportional to the mass per unit area of the sampled element. That is, for relatively thin samples, e.g., 1 $\mu$m or less, there is a linear increase of intensity with thickness. For a given thickness of a sample, or for a very thick sample, the peak intensity is proportional to the weight percent of the element in the sample. For samples having a thickness 1–10 $\mu$m, there is a logarithmic increase in intensity with thickness. XRF metrology techniques can be employed to measure thicknesses in this range, but the use of an algorithm called Fundamental Parameters (FP), which is known to those skilled in the art, is required.

Metal deposition processes are performed in the deposition chambers 22A, 22B. X-ray fluorescent measurements are performed in the XRF chamber 24 on a frequency to be determined by the appropriate process engineer. Wafers are transferred between and among the various chambers 22A, 22B, 24 and outside of the system 20, through the load/unload station 26 using a variety of known robotic transfer arms and mechanisms (not shown).

In one embodiment, the process chambers 22A, 22B are magnetron sputter deposition chambers in which metal atoms are sputtered off a metal target and deposited onto a wafer positioned within the process chambers 22A, 22B. The structure and operation of the process chambers 22A, 22B may be varied as a matter of design choice. For example, the process chambers 22A, 22B may be configured similar to the deposition chambers on commercially available sputter deposition tools such as the Novellus Inova system and the Endura or Electra systems sold by Applied Materials. However, as will be recognized by those skilled in the art, the present invention may be employed in a metal deposition system having a variety of structural variations. Thus, the particular structure and equipment used within the process chambers 22A, 22B should not be considered a limitation of the present invention unless such limitations are specifically set forth in the attached claims.

As will be recognized by those skilled in the art after a complete reading of the present application, the present invention may be used in the context of forming any type of metal layer by a deposition process, e.g., barrier metal layers, such as tantalum, tungsten, titanium, titanium nitride, copper seed layers, layers of refractory metal, such as cobalt, nickel, titanium, etc., and these layers may be formed to any desired thickness. Thus, the particular metal layer formed should not be considered a limitation of the present invention unless such limitations are specifically set forth in the attached claims.

For purposes of further explanation, the present invention will be further described in the context of forming a layer of refractory metal 66 above a partially formed transistor 50 (see FIG. 2). Of course, the present invention may be used in other contexts, such as forming a barrier metal layer above a patterned layer of insulating material, forming a titanium/titanium nitride bi-layer in a patterned layer of insulating material prior to forming conductive interconnections comprised of tungsten in such openings or forming a barrier metal layer and a copper seed layer. Thus, the particular context in which the present invention is employed should not be considered a limitation of the present invention unless such limitations are specifically set forth in the appended claims.

Figure 3:
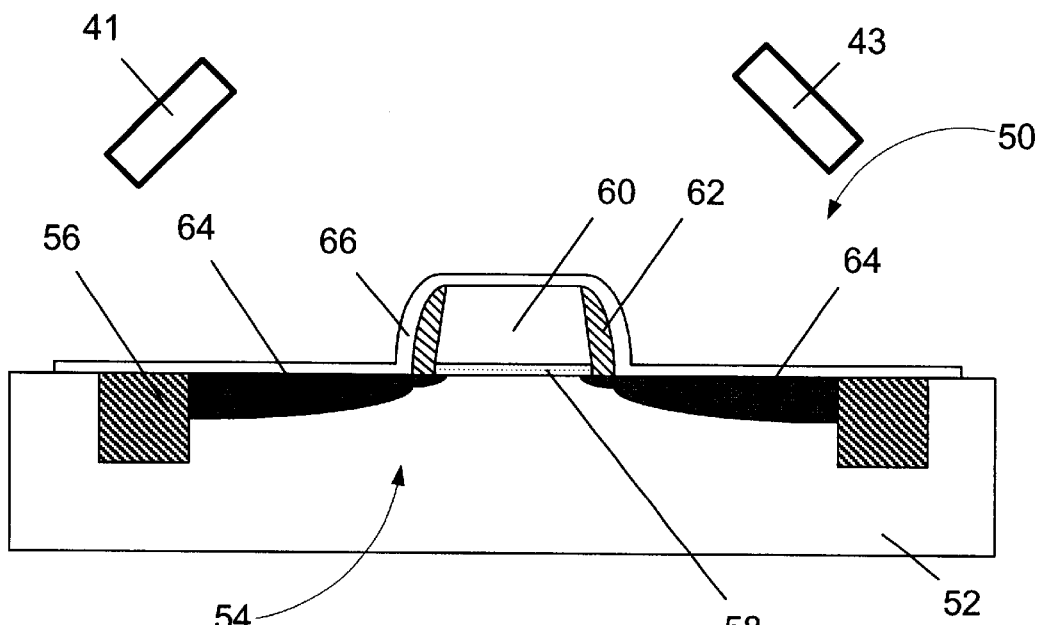
FIG. 3 is a cross-sectional view of a partially formed integrated circuit device having a layer of metal formed thereabove.

As shown in FIG. 3, a transistor 50 is formed within an active region 54 of a semiconducting substrate 52, as defined by isolation regions 56. The transistor 50 is generally comprised of a gate insulation layer 58, a gate electrode 60, sidewall spacers 62, and source/drain regions 64. In modern integrated circuit devices, metal silicide regions are typically formed above the source/drain regions 64 and/or the gate electrode 60 of such transistors in an effort to reduce the contact resistance of these various components, and thereby increase the operating speed of such devices. The process generally involves depositing a layer of refractory metal, e.g., cobalt, titanium, nickel, molybdenum, platinum, tantalum, etc., above the gate electrode 60 and the source/drain regions 64, and, thereafter, performing one or more anneal processes to convert the refractory metal into its corresponding silicide, e.g., cobalt silicide, titanium silicide, nickel silicide, etc., in the areas where the refractory metal is in contact with the source/drain regions 64 and gate electrode 60. The layer of refractory metal may be deposited using either a PVD process, a CVD process, or a plasma enhanced CVD process.

As shown in FIG. 3, a refractory metal layer 66 is deposited above the transistor 50. In one illustrative embodiment, the refractory metal layer 66 is comprised of cobalt and the desired or target thickness of the cobalt layer 66 is approximately 5–30 nm. As it relates to the present invention, the cobalt layer 66 may be deposited in the deposition chamber 22A of the system 20. Thereafter, the wafer 52 may be transferred to the XRF chamber 24 where XRF measurements may be taken to determine the thickness of the cobalt layer 66, as described more fully below. If the XRF measurements indicate that the thickness of the cobalt layer 66 is within specifications, i.e., within a preselected acceptable range, the wafer is allowed to be removed from the system 20 for further processing. If the thickness of the cobalt layer 66 exceeds a preselected allowable limit or is otherwise outside of an allowable range, an error or alarm signal may be generated and sent to the controller 28 of the system 20. In response, the controller 28 may cease further deposition processes until such time as the cause for the production of the excessively thick refractory metal layer 66 can be identified and corrected. If the XRF measurements indicate that the thickness of the cobalt layer 66 is less than a preselected value, i.e., less than the product specification allows, the wafer 52 may be returned to process chamber 22A, or to any other available process chamber, e.g., chamber 22B, where additional metal material may be deposited on the wafer 52. Thereafter, the wafer 52 may then be returned to the XRF chamber 24 for further measurements to insure that the cobalt layer 66 is within acceptable limits.

Within the XRF chamber 24, and as schematically indicated in FIG. 1, the cobalt layer 66 is irradiated with x-rays from a source 41 (typically an x-ray tube) and a detector 43 in the XRF chamber 24 is used to detect x-rays leaving the sampled area. Hardware and software within the XRF tool then analyzes the detected signals to produce a graph of the peak intensity (y-axis) vs. energy level (x-axis) of the fluoresced signals. Based upon a comparison of the peaks, the thickness of the cobalt layer 66 may be determined. Based upon the peak intensity, the number of atoms in the illuminated area is determined. By knowing the atomic density of the irradiated material, the thickness of the layer of material may be determined.

The number of sites selected per wafer for obtaining XRF metrology data, as well as the location of those sites, may be varied as a matter of design choice. For example, in some applications, the process engineer may determine that only a single site on a layer of metal need be analyzed using XRF techniques. Other applications may require more metrology data. For example, five sites on a layer of metal may be measured, one in the approximate center of the wafer and at four other sites spaced around the periphery of the wafer approximately 90° apart. Additionally, it may be appropriate to have more test sites in a given region of a wafer 52. The size of the irradiated areas may also vary, e.g., each of the irradiated areas may have a diameter ranging from approximately 100 $\mu$m–200 mm. If multiple sites are irradiated, the results of the XRF metrology data may be averaged, or otherwise statistically analyzed, to determine the thickness of the layer of metal.

Figure 4:
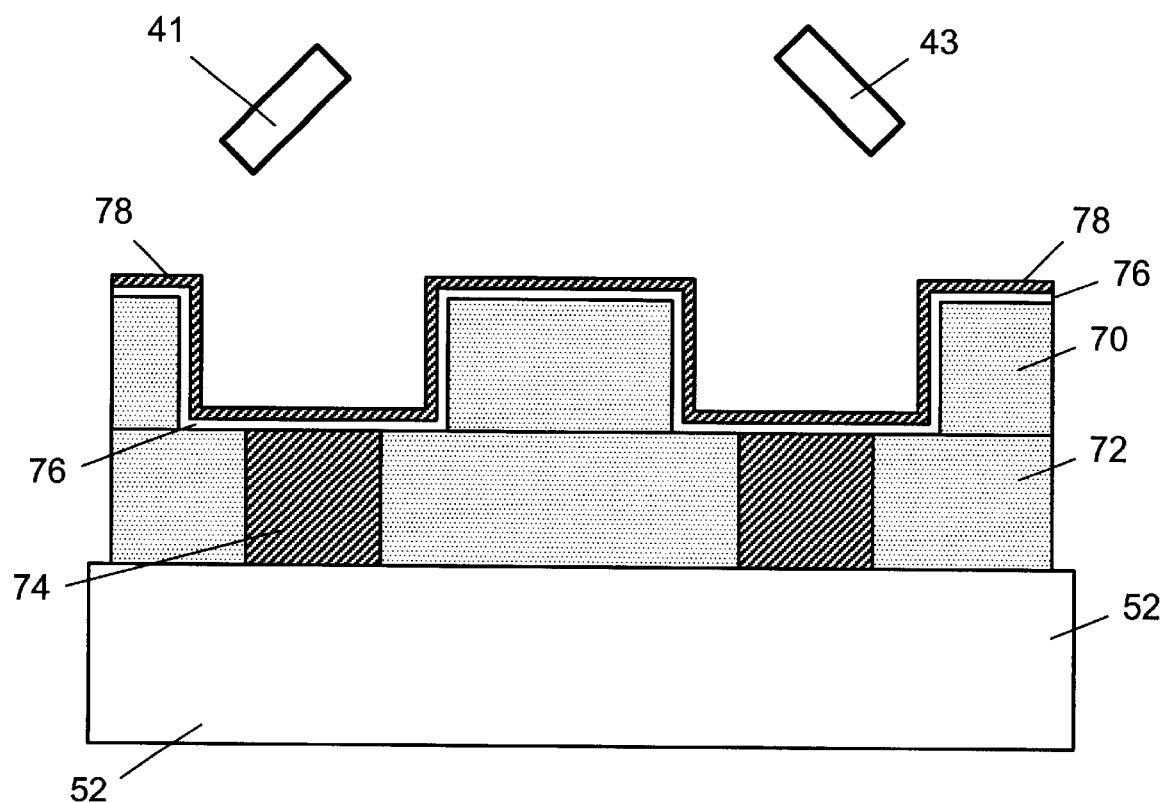
FIG. 4 is a cross-sectional view of a partially formed integrated circuit having multiple layers of metal formed thereabove.

The present invention may also be employed in the context of forming multiple layers of metal above one another. By way of example, FIG. 4 depicts an illustrative situation where a wafer 52 has a patterned layer of insulating material 70 formed above a previously formed layer of insulating material 72 having a plurality of conductive interconnections 74, e.g., lines or plugs, formed therein. As shown further in FIG. 4, a first metal layer 76, e.g., a barrier metal layer comprised of, for example, tantalum, and a second metal layer 78, e.g., a copper seed layer, are formed above the patterned layer of insulating material 70.

In this situation, with an XRF tool 24 in the configuration depicted in FIG. 1 or 2, the first metal layer 76 may be deposited, and the XRF tool 24 may be used to determine the thickness of the first metal layer 76. If the first metal layer 76 is within product specifications, the second metal layer 78 may then be formed above the first metal layer 76. If the first metal layer 76 is too thin, additional metal maybe formed to increase the thickness of the first metal layer 76 until it is within specification. Thereafter, the second metal layer 78 may be formed above the first metal layer 76. Of course, the first and second metal layers 78, 78 may be formed in the same or different deposition chambers. Moreover, the present invention may be employed in the context of forming more than two metal layers, and in forming different combinations of material other than the illustrative tantalum/copper layer described above, e.g., titanium/titanium nitride, tantalum/tantalum nitride, etc.

In the illustrated embodiment, the controller 28 is a computer programmed with software to implement the functions described herein. Moreover, the functions described for the controller 28 may be performed by one or more controllers spread through the system. For example, the controller 28 may be a fab level controller that is used to control processing operations throughout all or a portion of a semiconductor manufacturing facility. Alternatively, the controller 28 may be a lower level computer that controls only portions or cells of the manufacturing facility. Moreover, the controller 28 may be a stand-alone device. However, as will be appreciated by those of ordinary skill in the art, a hardware controller (not shown) designed to implement the particular functions may also be used. The XRF tool 24 may also have a separate controller (not shown) to analyze the x-ray metrology data. Moreover, in some embodiments, e.g., where the XRF tool 24 is part of the system 20, the various functions described herein may be performed by one or more controllers in the system 20.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 28, as described, is the Catalyst™ system offered by KLA Tencor, Inc. The Catalyst™ system uses Semiconductor Equipment and Materials. International (SEMI) Computer Integrated Manufacturing (CIM) Framework compliant system technologies, and is based on the Advanced Process Control (APC) Framework. CIM (SEMI E810699—Provisional Specification for CIM Framework Domain Architecture) and APC (SEMI E93-0999—Provisional Specification for CIM framework Advanced Process Control Component) specifications are publicly available from SEMI.

The present invention is directed to methods of controlling the thickness of deposited metal layers. Such layers may be formed by a CVD process, a PVD process or a plasma enhanced CVD process. In one illustrative embodiment, the method comprises depositing a layer of metal above a structure, irradiating at least one area of the layer of metal, and analyzing an x-ray spectrum of x-rays leaving the irradiated area to determine a thickness of the layer of metal. In further embodiments of the present invention, the layer of metal may be comprised of titanium, tantalum, cobalt, nickel, copper, molybdenum, or other metals. In yet further embodiments, a plurality of areas of the layer of metal are irradiated.

In another illustrative embodiment, the method comprises depositing a first layer of metal above a structure, irradiating at least one area of the first layer of metal, analyzing an x-ray spectrum of x-rays leaving the irradiated area of the first layer of metal to determine a thickness of the first layer of metal, depositing a second layer of metal above the first layer of metal, irradiating at least one area of the second layer of metal, and analyzing an x-ray spectrum of x-rays leaving the irradiated area of the second layer of metal to determine a thickness of the second layer of metal.

Through use of the present invention, the production of layers of metal may be more precisely controlled. As a result, overall manufacturing efficiencies may be increased.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:

depositing a first layer of metal above a patterned layer of insulating material having a plurality of openings formed therein;

irradiating at least one area of said first layer of metal;

analyzing an x-ray spectrum of x-rays leaving said irradiated area of said first layer of metal to determine a thickness of said first layer of metal;

depositing a second layer of metal above said first layer of metal;

irradiating at least one area of said second layer of metal; and analyzing an x-ray spectrum of x-rays leaving said irradiated area of said second layer of metal to determine a thickness of said second layer of metal.

2. The method of claim 1, further comprising indicating an alarm condition if said determined thickness of said first layer of metal exceeds a preselected value.

3. The method of claim 1, further comprising indicating an alarm condition if said determined thickness of said second layer of metal exceeds a preselected value.

4. The method of claim 1, further comprising depositing additional metal material above said first layer of metal if said determined thickness of said first layer of metal is less than a preselected value.

5. The method of claim 1, further comprising depositing additional metal material above said second layer of metal if said determined thickness of said second layer of metal is less than a preselected value.

6. The method of claim 1, wherein depositing a first layer of metal above a structure comprises depositing a first layer of metal comprised of at least one of titanium, cobalt, nickel, tantalum, molybdenum, copper and platinum above a structure.

7. The method of claim 1, wherein depositing a second layer of metal above a structure comprises depositing a second layer of metal comprised of at least one of titanium, cobalt, nickel, tantalum, molybdenum, copper and platinum above said first metal layer.

8. The method of claim 1, wherein depositing a first layer of metal above a structure comprises performing at least one of a physical vapor deposition process, a chemical vapor deposition process and a plasma enhanced chemical vapor deposition process to deposit a first layer of metal above a structure.

9. The method of claim 1, wherein depositing a second layer of metal above a structure comprises performing at least one of a physical vapor deposition process, a chemical vapor deposition process and a plasma enhanced chemical vapor deposition process to deposit a second layer of metal above said first layer of metal.

10. The method of claim 1, wherein irradiating at least one area of said first layer of metal comprises irradiating a plurality of areas of said first layer of metal.

11. The method of claim 1, wherein irradiating at least one area of said second layer of metal comprises irradiating a plurality of areas of said second layer of metal.

12. The method of claim 1, wherein irradiating at least one area of said first layer of metal comprises irradiating at least five areas of said first layer of metal.

13. The method of claim 1, wherein irradiating at least one area of said second layer of metal comprises irradiating at least five areas of said second layer of metal.

14. The method of claim 1, wherein depositing a first layer of metal above a structure comprises depositing a first layer of metal above a gate electrode and a plurality of source/drain regions of a transistor.

15. The method of claim 1, wherein said first metal layer and said second metal layer are comprised of tantalum and copper, respectively.

16. The method of claim 1, wherein said step of depositing a second layer of metal is only performed if said thickness of said first layer of metal is within a preselected range.

17. A method, comprising:

performing at least one of a physical vapor deposition process, a chemical vapor deposition process and a plasma enhanced chemical vapor deposition process to deposit a first layer of metal comprised of at least one of titanium, cobalt, nickel, tantalum, molybdenum, copper and platinum above a patterned layer of insulating material having a plurality of openings formed therein;

irradiating at least one area of said first layer of metal;

analyzing an x-ray spectrum of x-rays leaving said irradiated area of said first layer of metal to determine a thickness of said first layer of metal;

performing at least one of a physical vapor deposition process, a chemical vapor deposition process and a plasma enhanced chemical vapor deposition process to deposit a second layer of metal above said first layer comprised of at least one of titanium, cobalt, nickel, tantalum, molybdenum, copper and platinum above a structure of metal;

irradiating at least one area of said second layer of metal; and analyzing an x-ray spectrum of x-rays leaving said irradiated area of said second layer of metal to determine a thickness of said second layer of metal.

18. The method of claim 17, further comprising indicating an alarm condition if said determined thickness of said first layer of metal is not within a preselected range.

19. The method of claim 17, further comprising indicating an alarm condition if said determined thickness of said second layer of metal is not within a preselected range.

20. The method of claim 17, further comprising depositing additional metal material above said first layer of metal if said determined thickness of said first layer of metal is less than a preselected value.

21. The method of claim 17, further comprising depositing additional metal material above said second layer of metal if said determined thickness of said second layer of metal is less than a preselected value.

22. The method of claim 17, wherein irradiating at least one area of said first layer of metal comprises irradiating a plurality of areas of said first layer of metal.

23. The method of claim 17, wherein irradiating at least one area of said second layer of metal comprises irradiating a plurality of areas of said second layer of metal.

24. The method of claim 17, wherein irradiating at least one area of said first layer of metal comprises irradiating at least five areas of said first layer of metal.

25. The method of claim 17, wherein irradiating at least one area of said second layer of metal comprises irradiating at least five areas of said second layer of metal.

26. The method of claim 17, wherein depositing a first layer of metal above a structure comprises depositing a first layer of metal above a gate electrode and a plurality of source/drain regions of a transistor.

27. The method of claim 17, wherein said first metal layer and said second metal layer are comprised of tantalum and copper, respectively.

28. The method of claim 17, wherein said step of depositing a second layer of metal is only performed if said thickness of said first layer of metal is within a preselected range.

* * * * *